(12) United States Patent
Ito et al.

(10) Patent No.: US 9,549,459 B2
(45) Date of Patent: Jan. 17, 2017

(54) MULTILAYER PRINTED CIRCUIT BOARD

(75) Inventors: Yoshinobu Ito, Hyogo (JP); Hideo Oosumi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 146 days.

(21) Appl. No.: 14/374,198

(22) PCT Filed: Jan. 27, 2012

(86) PCT No.: PCT/JP2012/000522
§ 371 (c)(1),
(2), (4) Date: Jul. 23, 2014

(87) PCT Pub. No.: WO2013/111194
PCT Pub. Date: Aug. 1, 2013

(65) Prior Publication Data
US 2014/0334121 A1 Nov. 13, 2014

(51) Int. Cl.
*H05K 7/10* (2006.01)
*H05K 7/12* (2006.01)
(Continued)

(52) U.S. Cl.
CPC ....... *H05K 1/0216* (2013.01); *H01L 23/49827* (2013.01); *H01L 23/50* (2013.01);
(Continued)

(58) Field of Classification Search
CPC ... H05K 1/112; H01L 23/5382; H01L 23/5384
(Continued)

(56) References Cited

U.S. PATENT DOCUMENTS 5,272,600 A * 12/1993 Carey ................. H01L 23/5384
174/255
5,544,018 A * 8/1996 Sommerfeldt ...... H01L 23/5382
257/E23.171
(Continued)

FOREIGN PATENT DOCUMENTS

JP 10-303562 A 11/1998
JP 2001-148448 A 5/2001
(Continued)

OTHER PUBLICATIONS

Notification of Transmittal of Translation of the International Preliminary Report on Patentability issued in International Application No. PCT/JP2012/000522 dated Aug. 7, 2014.
(Continued)

*Primary Examiner* — Tuan T Dinh
(74) *Attorney, Agent, or Firm* — McDermott Will & Emery LLP (57) ABSTRACT

A multilayer PCB comprises vias for power-supply connected to power-supply wiring, vias for ground connected to ground wiring, ball pads for power-supply connected to balls for power-supply connected to power-supply wiring, and ball pads for ground connected to balls for ground connected to ground wiring. The vias for power-supply and the vias for ground are alternately arranged in a first direction. The vias for power-supply and the vias for ground are not alternately arranged in a second direction perpendicular to the first direction. The ball pads for power-supply and the ball pads for ground are alternately arranged in at least one of the first and second directions. Areas where the ball pads for power-supply and the ball pads for ground are provided are arranged on both sides in the second direction of an area where the vias for power-supply and the vias for ground are provided.

2 Claims, 5 Drawing Sheets

(51) Int. Cl.
*H05K 1/02* (2006.01)
*H01L 23/498* (2006.01)
*H01L 23/50* (2006.01)
*H05K 1/18* (2006.01)
*H05K 1/11* (2006.01)

(52) U.S. Cl.
CPC .......... *H05K 1/0243* (2013.01); *H05K 1/114* (2013.01); *H05K 1/18* (2013.01); *H01L 2924/0002* (2013.01); *H05K 1/113* (2013.01); *H05K 2201/09227* (2013.01)

(58) Field of Classification Search
USPC ............... 361/760–763, 767–774, 792–795; 174/259–264
See application file for complete search history.

(56) References Cited

U.S. PATENT DOCUMENTS

| | | | |
|---|---|---|---|
| 6,121,554 | A | 9/2000 | Kamikawa |
| 6,198,635 | B1 | 3/2001 | Shenoy et al. |
| 6,305,002 | B1 * | 10/2001 | Uchida ............... H01L 23/50 |
| | | | 257/E23.079 |
| 6,768,206 | B2 | 7/2004 | Hosomi |
| 6,992,374 | B1 | 1/2006 | Yang et al. |
| 7,227,260 | B2 | 6/2007 | Goto et al. |
| 7,368,667 | B2 | 5/2008 | Brown |
| 7,659,481 | B2 | 2/2010 | Miyagawa |
| 8,129,625 | B2 | 3/2012 | Kato |
| 8,350,375 | B2 * | 1/2013 | Ali ..................... H01L 23/5286 |
| | | | 257/691 |
| 2003/0209807 | A1 | 11/2003 | Hosomi |
| 2004/0003941 | A1 * | 1/2004 | Duxbury ............... H05K 1/112 |
| | | | 174/261 |
| 2005/0248040 | A1 * | 11/2005 | Osburn ............ H01L 23/49838 |
| | | | 257/786 |
| 2006/0082001 | A1 | 4/2006 | Miyagawa |
| 2006/0087028 | A1 | 4/2006 | Goto et al. |
| 2007/0029106 | A1 | 2/2007 | Kato |
| 2007/0034405 | A1 | 2/2007 | Brown |

FOREIGN PATENT DOCUMENTS

| | | |
|---|---|---|
| JP | 2003-332377 A | 11/2003 |
| JP | 2006-114777 A | 4/2006 |
| JP | 2006-128687 A | 5/2006 |
| JP | 2010-283396 A | 12/2010 |

OTHER PUBLICATIONS

International Search Report issued in International Application No. PCT/JP2012/000522, with Date of mailing Mar. 19, 2012, with English Translation.

Extended European Search Report issued in corresponding European Patent Application No. 12866538.7, mailed on Jul. 21, 2015; 6 pages.

* cited by examiner

MULTILAYER PRINTED CIRCUIT BOARD

RELATED APPLICATIONS

This application is a national phase of International Application No. PCT/JP2012/000522, filed on Jan. 27, 2012, the disclosure of which Application is incorporated by reference herein.

TECHNICAL FIELD

The present disclosure relates to a multilayer printed circuit board mounting an integrated circuit (IC).

BACKGROUND ART

Among printed circuit boards (PCB) each mounting a BGA (Ball Grid Array) type integrated circuit (IC), there is a printed circuit board (PCB) in which a conductor layer and an interlayer insulating layer are alternately formed in multilayer. In the above-described multilayer printed circuit board (PCB), a number of vias for power supply and a number of vias for ground are arranged.

In a surface of the above-described multilayer PCB, a number of pads for balls to connect with array-shaped balls in the integrated circuit (IC) are also arranged. When the integrated circuit (IC) is mounted on the multilayer PCB, a number of pads for balls and a number of balls of the integrated circuit (IC) are connected. FIG. 6(1) shows a side view of a multilayer PCB 10 mounting an integrated circuit (IC) 50 made up of an IC chip 40, a package substrate 30, and balls 20. In FIG. 6(1), a surface of the multilayer PCB 10 is connected to a lower surface of the package substrate 30 through pads and balls 20.

Since integration in the BGA type integrated circuit (IC) has been advanced increasingly, the vias for power supply and the vias for ground in the one multilayer PCB have been increased in number more and more. Consequently, there arises a problem that in the multilayer PCB, undesirable induced electromotive forces are easily caused, which deteriorates reliability and electric characteristics of the integrated circuit (IC) and the multilayer PCB.

In order to solve the above-described problem, in a multilayer PCB disclosed in Patent Document 1, as shown in FIG. 6(2), vias for power supply 2 and vias for ground 6 are arranged in a grid shape. The grid-shaped arrangement as shown in FIG. 6(2) allows the induced electromotive forces caused by the vias in the multilayer PCB 10 to be mutually cancelled, and a mutual inductance between the individual vias becomes small, so that the reliability and the electric characteristics of the whole multilayer PCB 10 are improved.

PRIOR ART DOCUMENTS

Patent Documents

Patent Document 1: JP 2010-283396 A
Patent Document 2: JP 2006-114777 A
Patent Document 3: US 2007/0034405 A1

SUMMARY OF INVENTION

Problems to be Solved by the Invention

In the multilayer PCB disclosed in Patent Document 1, in order to increase an effect of cancelling the induced electromotive forces more, it is essential to arrange the vias for power supply and the vias for ground as close as possible. However, the close arrangement of the vias for power supply and the vias for ground causes a problem that conductor area between the vias becomes small, and wiring inductances of a power supply, a ground, other power supplies each having a different potential and the like rise, which deteriorates the reliability and the electric characteristics. Furthermore, in a case where components such as a bypass capacitor and the like are needed in a lower surface of the multilayer PCB, it is very difficult to arrange the components.

One non-limiting and exemplary embodiment enables, in a multilayer PCB mounting an integrated circuit (IC), occurrence of induced electromotive forces in the multilayer PCB to be suppressed, and enables components such as a bypass capacitor and the like to be arranged in a lower surface of the multilayer PCB even if a case where the components are needed in the lower surface arises, while reducing noise countermeasure components such as the bypass capacitor and the like.

Means for Solving the Problem

One non-limiting and exemplary embodiment provides a multilayer PCB mounting an integrated circuit, comprising: a plurality of vias for power supply electrically connected to power supply wiring; a plurality of vias for ground electrically connected to ground wiring; a plurality of ball pads for power supply connected to balls for power supply electrically connected to power supply wiring of the integrated circuit; and a plurality of ball pads for ground connected to balls for ground electrically connected to ground wiring of the integrated circuit,
wherein while the vias for power supply and the vias for ground are alternately arranged in a first direction, the vias for power supply and the vias for ground are not alternately arranged in a second direction perpendicular to the first direction,
the ball pads for power supply and the ball pads for ground are alternately arranged in at least one of the first direction and the second direction, and
areas where the ball pads for power supply and the ball pads for ground are provided are arranged on both sides in the second direction of an area where the vias for power supply and the vias for ground are provided.

Effects of the Invention

In the multilayer PCB of the present disclosure, since the vias for power supply and the vias for ground are alternately arranged in the first direction, occurrence of induced electromotive forces in the multilayer PCB can be suppressed. Moreover, the areas where the ball pads for power supply and the ball pads for ground are provided are arranged on both sides in the second direction of the area where the vias for power supply and the vias for ground are provided, the second direction being perpendicular to the first direction where the vias for power supply and the vias for ground are alternately arranged, and thus, enough area to arrange the components such as the bypass capacitor and the like can be provided in the lower surface of the multilayer PCB.

BRIEF DESCRIPTION OF DRAWINGS

FIG. 6(1) is a side view of a general multilayer PCB mounting an integrated circuit (IC), and FIG. 6(2) is a plan view showing arrangement of vias in a surface of a conventional multilayer PCB.

MODE FOR CARRYING OUT THE INVENTION

Hereinafter, referring to the drawings, preferred embodiments according to the present disclosure will be described.

First Embodiment

1. Configuration 1.1. Configuration of Multilayer Printed Circuit Board (PCB)

FIG. 1(a) is a view showing arrangement of vias and wiring in a surface of a multilayer PCB according to a first embodiment of the present disclosure. A surface of a multilayer PCB 10 shown in FIG. 1(a) is a surface in contact with balls 20 in a lower surface of a package substrate 30, as shown in FIG. 6(1).

Figure 1:
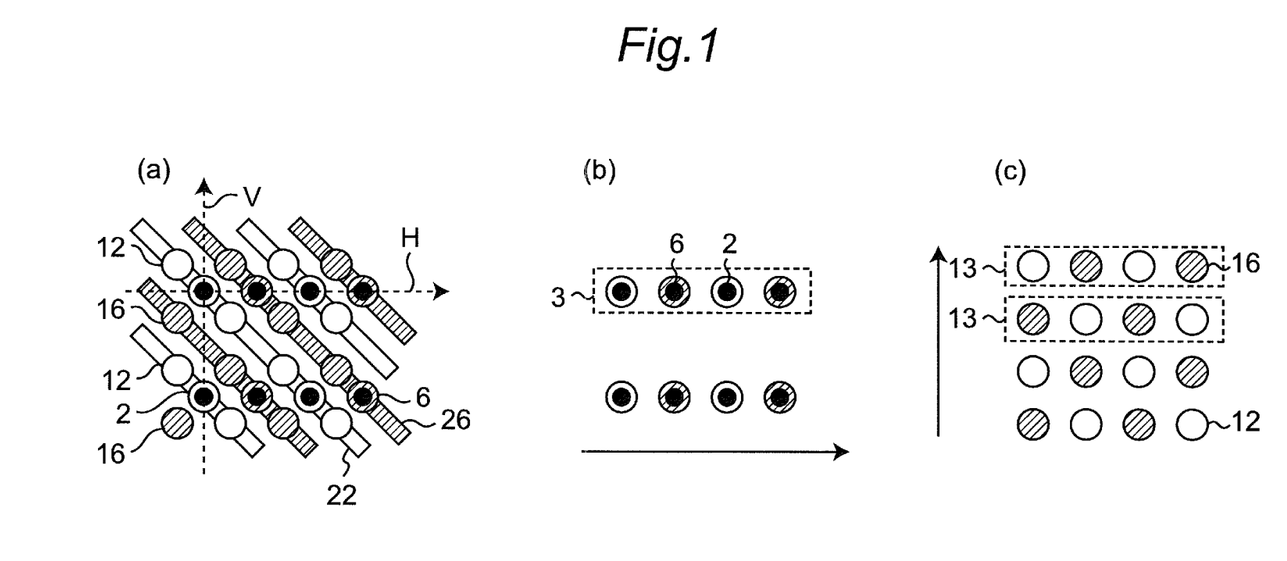
FIG. 1 are plan views of a part of a surface of a multilayer printed circuit board (PCB) according to a first embodiment of the present disclosure.

In the multilayer PCB 10 shown in FIG. 1(a), a number of vias for power supply 2 and a number of vias for ground 6 are arranged. Particularly, the vias for power supply 2 and the vias for ground 6 are alternately arranged in a lateral direction (in a direction H) in FIG. 1. However, they are not alternately arranged in a longitudinal direction (in a direction V).

Furthermore, in the surface of the multilayer PCB 10 shown in FIG. 1(a), a number of ball pads for power supply 12 and a number ball pads for ground 16 are arranged. Particularly, the ball pads for power supply 12 and the ball pads for ground 16 are alternately arranged in the longitudinal direction in FIG. 1. As shown in FIG. 1(a), in the surface of the multilayer PCB 10, the vias for power supply 2 and the ball pads for power supply 12 are connected by power supply wiring 22. Similarly, in the surface of the multilayer PCB 10, the vias for ground 6 and the ball pads for ground 16 are connected by ground wiring 26. The power supply wiring 22 and the ground wiring 26 are alternately arranged. The balls 20 of the package substrate 30 are connected onto the ball pads 12, 16.

FIG. 1(b) is a plan view for explaining only the arrangement of the vias for power supply 2 and the vias for ground 6. As is evident from FIG. 1(b), while the vias for power supply 2 and the vias for ground 6 are alternately arranged in the lateral direction, they are not alternately arranged in the longitudinal direction. Moreover, FIG. 1(c) is a view showing only the arrangement of the ball pads for power supply 12 and the ball pads for ground 16 in FIG. 1(a). As is evident from FIG. 1(c) as well, the ball pads for power supply 12 and the ball pads for ground 16 are alternately arranged in the longitudinal direction and in the lateral direction.

In the multilayer PCB 10 shown in FIG. 1, since the vias for power supply 2 and the vias for ground 6 are alternately arranged in the lateral direction, induced electromotive forces caused in the multilayer PCB 10 by currents flowing through the vias are mutually cancelled.

1.2. Configuration of Integrated Circuit (IC)

When the package substrate 30 is mounted on the multilayer PCB 10, the ball pads for power supply 12 of the multilayer PCB 10 are directly connected to balls for power supply 20a of the package substrate 30, and the ball pads for ground 16 of the multilayer PCB 10 are directly connected to balls for ground 20b of the package substrate 30. That is, between the multilayer PCB 10 and the package substrate 30, positions of the ball pads for power supply 12 of the multilayer PCB 10 correspond to positions of the balls for power supply 20a of the package substrate 30, and positions of the ball pads for ground 16 of the multilayer PCB 10 correspond to positions of balls for ground 20b of the package substrate 30.

Figure 2:
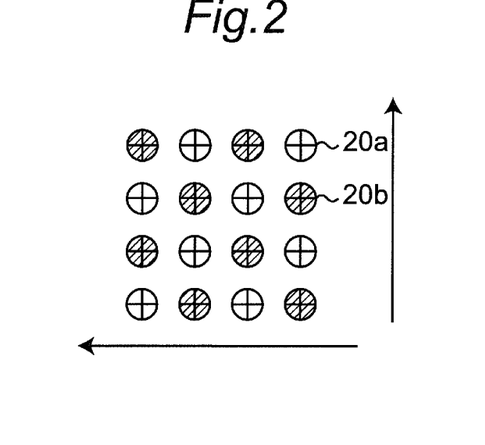
FIG. 2 is a view showing arrangement of balls in a lower surface of an integrated circuit (IC) mounted on the multilayer PCB according to the first embodiment of the present disclosure.

FIG. 2 is a view showing arrangement of the balls (the balls for power supply 20a, the ball for ground 20b) in a lower surface of the integrated circuit (IC) 50 mounted on the multilayer PCB 10 according to the first embodiment of the present disclosure. In the lower surface of the package substrate 30 connected to the multilayer PCB 10, the balls for power supply 20a connected to the ball pads for power supply 12 and the balls for ground 20b connected to the ball pads for ground 16 are alternately arranged. This arrangement of the balls 20 allows induced electromotive forces to be mutually cancelled, which induced electromotive forces may be caused by currents flowing in the balls in the package substrate 30 as well.

2. Operation of Multilayer PCB and Package Substrate

Figure 3:
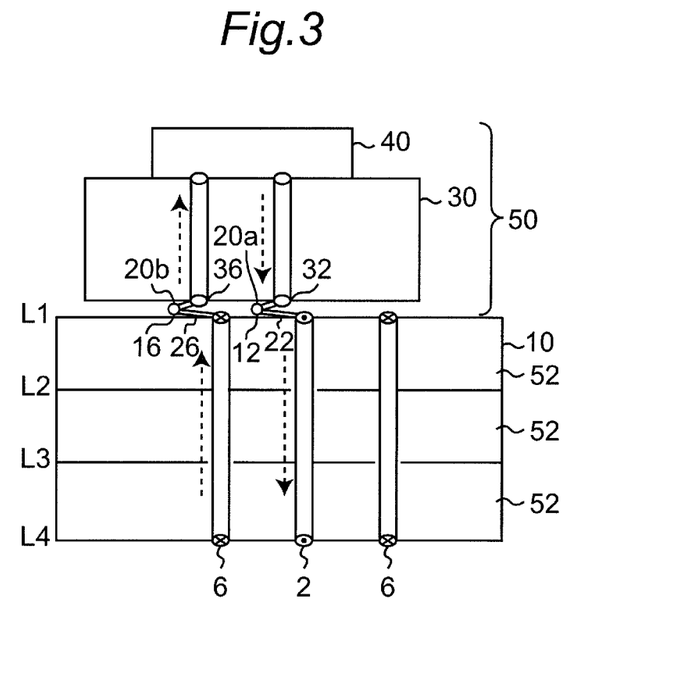
FIG. 3 is a view schematically showing partial cross sections of the multilayer PCB and the integrated circuit (IC) according to the first embodiment of the present disclosure.

FIG. 3 is a view schematically showing partial cross sections of the multilayer PCB 10 and the package substrate 30 according to the first embodiment of the present disclosure. The multilayer PCB 10 shown in FIG. 3 is made up of a plurality of conductor layers L1, L2, L3, L4. Resin layers 52 are formed between the respective conductor layers L1, L2, L3, L4. Here, the second conductor layer L2 is a conductor layer (a ground layer) connected to a ground, and is electrically connected to the vias for ground 6. The third conductor layer L3 is a conductor layer (a power supply layer) connected to a power supply, and is electrically connected to the vias for power supply 2. Thus, the alternative arrangement of the vias for ground 6 and the vias for power supply 2 in the predetermined direction allows the induced electromotive forces caused by the currents flowing through the respective vias to be mutually cancelled. FIG. 3 shows one example of the four-layer penetrating board, and the ground layer and the power supply layer are also examples. Thus, as a layer configuration of the multilayer PCB 10, others than four layers may be employed, and the ground layer and the power supply layer may be each configured by any of the layers, or may be wired as mere patterns.

Furthermore, the vias for ground 6 of the multilayer PCB 10 are connected to the balls for ground 20b in the package substrate 30 and vias for ground inside the package substrate 36 through the ground wiring 26 and the ball pads for ground 16. Similarly, the vias for power supply 2 of the multilayer PCB 10 are connected to the balls for power supply 20a in the package substrate 30 and vias for power supply inside the package substrate 32 through the power supply wiring 22 and the ball pads for power supply 12. As described before, the ball pads for power supply 12 and the ball pads for ground 16 are alternately arranged with respect to the predetermined directions. In response to this, in the package substrate 30, the balls for power supply 20*a* connected to the ball pads for power supply 12 and the vias for power supply inside LSI 32 connected to these balls, and the balls for ground 20*b* connected to the ball pads for ground 12 and the vias for ground inside LSI 36 connected to these balls are alternately arranged with respect to the predetermined directions. This alternate arrangement allows the induced electromotive forces caused by the currents flowing in the respective balls and the respective vias in the package substrate 30 to be mutually cancelled. While the vias for ground 36 and the vias for power supply 32 of the package substrate 30 in FIG. 3 are shown as penetrating vias, these may be built-up ones.

As described above, the arrangement of the vias in the multilayer PCB 10 and the arrangement of the balls in the package substrate 30 allow the induced electromotive forces caused in the multilayer PCB 10 and in the package substrate 30 to be mutually cancelled, which can make mutual inductance small. This increases the reliability and the electric characteristics of a whole system including the package substrate 30 and the multilayer PCB 10.

In FIG. 1, areas 13 where the ball pads for power supply 12 and the ball pads for ground 16 are provided are arranged on both sides in the longitudinal direction of an area 3 where the vias for power supply 2 and the vias for ground 6 are provided. That is, when the longitudinal direction in FIG. 1 is focused, the adjacent vias 2, 6 are arranged apart enough to arrange at least 2 lines of the ball pads 12, 16. Thus, in the longitudinal direction perpendicular to the lateral direction in FIG. 1, enough area to arrange components such as a bypass capacitor and the like is provided in the lower surface of the multilayer PCB 10. In view of easiness of the arrangement of the components in the lower surface of the multilayer PCB 10, it is preferable that, as shown in FIG. 1, the vias for power supply 2 and the vias for ground 6 are not alternately arranged in the direction (in FIG. 1, in the longitudinal direction) perpendicular to the direction where the vias for power supply 2 and the bias for ground 6 are alternately arranged.

3. Other Arrangement in First Embodiment

In FIGS. 1 and 2, the arrangement of the vias for power supply 2, the vias for ground 6, the ball pads for power supply 12, and the ball pads for ground 16 in the multilayer PCB 10, and the arrangement of the balls 20 in the package substrate 30 according to the first embodiment of the present disclosure are shown. The arrangements in the multilayer PCB 10 and the package substrate 30 according to the first embodiment is not limited to that of FIGS. 1 and 2. Examples of other arrangement will be described with reference to FIGS. 4 and 5.

Figure 4:
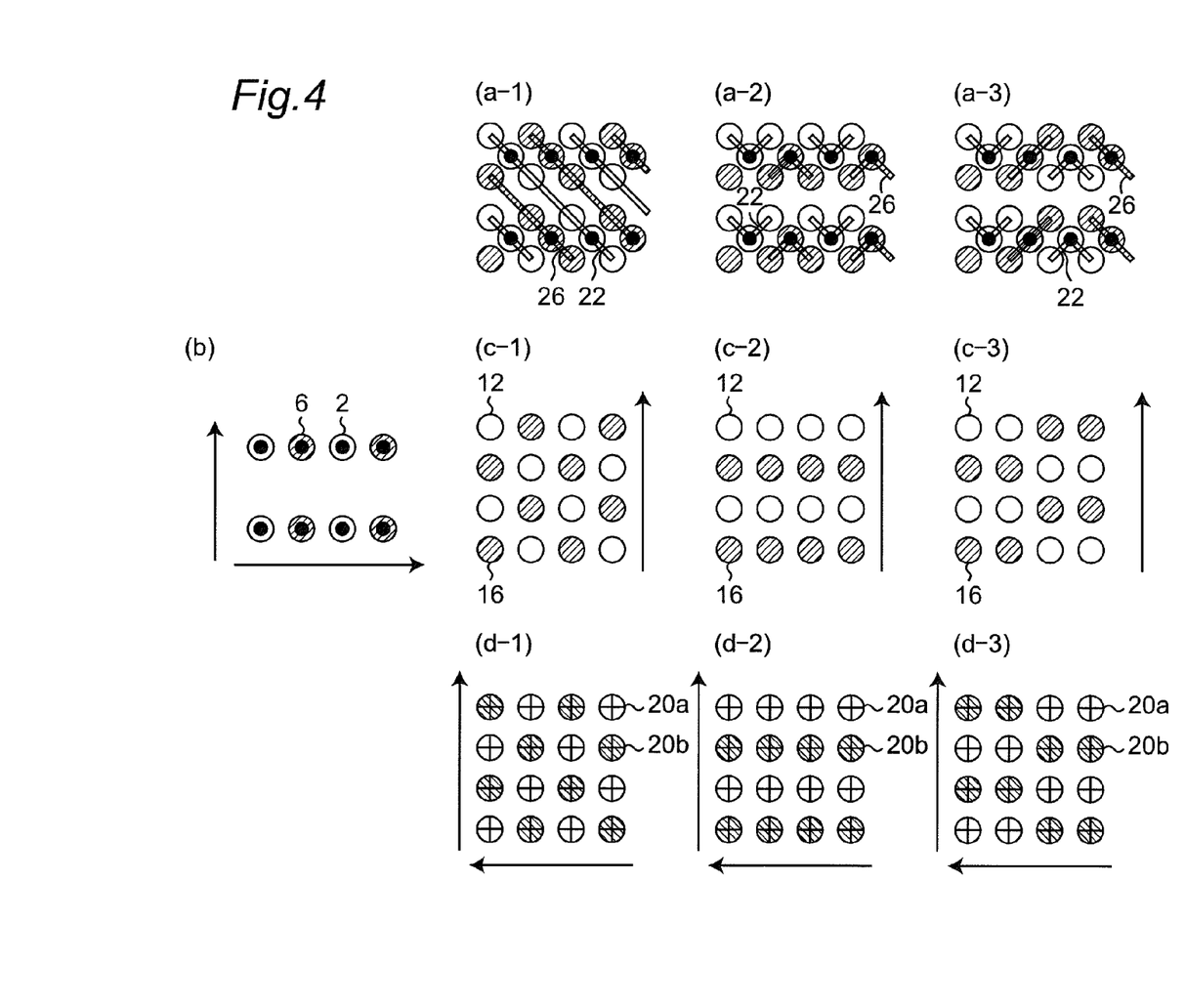
FIG. 4 are plan views showing various types of arrangement in the first embodiment of the present disclosure.

For reference, in FIG. 4(*a*-1), the same arrangement as that shown in FIG. 1(*a*) is shown. This arrangement can be realized by the combination of the arrangement of the vias for power supply 2 and the vias for ground 6 shown in FIG. 4(*b*), and the arrangement of the ball pads for power supply 12 and the ball pads for ground 16 shown in FIG. 4(*c*-1). FIG. 4(*d*-1) is a view showing the arrangement of the balls for power supply 20*a* and the balls for ground 20*b* in the lower surface of the package substrate 30 mounted on the multilayer PCB 10 at this time.

(1) First Example of Other Arrangement

A first example of the other arrangement is shown in FIG. 4(*a*-2). The arrangement shown in FIG. 4(*a*-2) can be realized by combination of the arrangement of the vias for power supply 2 and the vias for ground 6 shown in FIG. 4(*b*), and the arrangement of the ball pads for power supply 12 and the ball pads for ground 16 shown in FIG. 4(*c*-2). That is, with the arrangement of the ball pads, as shown in FIG. 4(*c*-2), the same type of ball pads 12, 16 are arranged in the lateral direction, and the ball pads for power supply 12 and the ball pads for ground 16 are alternately arranged in the longitudinal direction. FIG. 4(*d*-2) is a view showing the arrangement of the balls for power supply 20*a* and the balls for ground 20*b* in the lower surface of the package substrate 30 mounted on the multilayer PCB 10 at this time.

(2) Second Example of Other Arrangement

A second example of the other arrangement is shown in FIG. 4(*a*-3). The arrangement shown in FIG. 4(*a*-3) can be realized by combination of the arrangement of the vias for power supply 2 and the vias for ground 6 shown in FIG. 4(*b*), and the arrangement of the ball pads for power supply 12 and the ball pads for ground 16 shown in FIG. 4(*c*-3). That is, with the arrangement of the ball pads, as shown in FIG. 4(*c*-3), the same type of ball pads 12, 16 are arranged two by two in the lateral direction, and the ball pads for power supply 12 and the ball pads for ground 16 are alternately arranged in the longitudinal direction. FIG. 4(*d*-3) is a view showing the arrangement of the balls for power supply 20*a* and the balls for ground 20*b* in the lower surface of the package substrate 30 mounted on the multilayer PCB 10 at this time.

(3) Third Example of Other Arrangement

Figure 5:
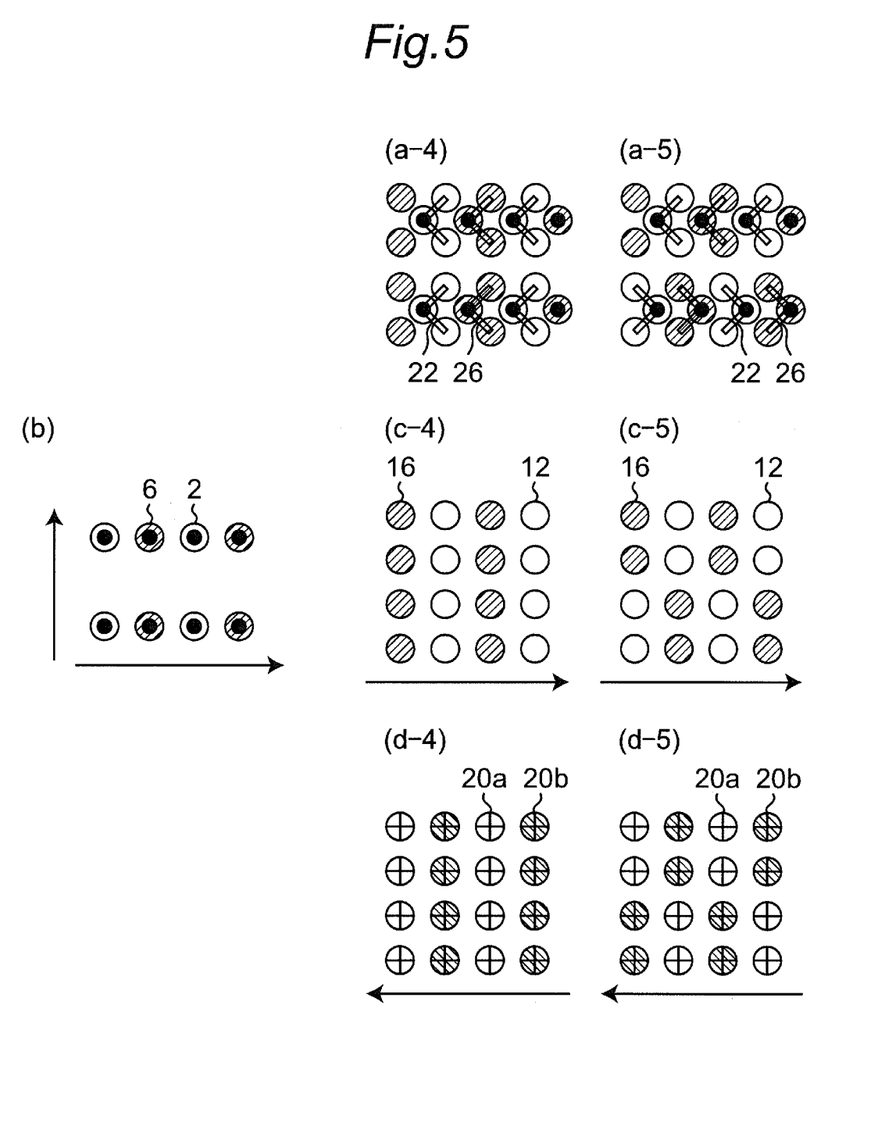
FIG. 5 are plan views showing various types of arrangement in the first embodiment of the present disclosure.
Figure 6:
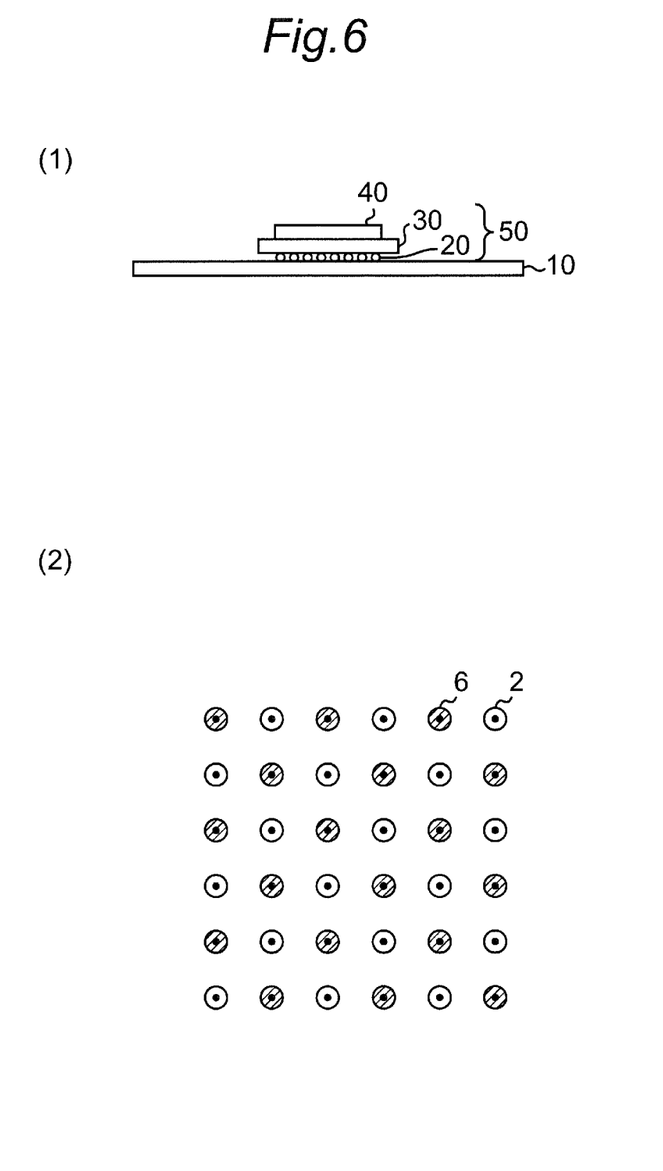

A third example of the other arrangement is shown in FIG. 5(*a*-4). The arrangement shown in FIG. 5(*a*-4) can be realized by combination of the arrangement of the vias for power supply 2 and the vias for ground 6 shown in FIG. 5(*b*), and the arrangement of the ball pads for power supply 12 and the ball pads for ground 16 shown in FIG. 5(*c*-4). The arrangement of the vias for power supply 2 and the vias for ground 6 shown in FIG. 5(*b*) is the same as the arrangement of the vias for power supply 2 and the vias for ground 6 shown in FIG. 4(*b*).

With the arrangement of the ball pads, as shown in FIG. 5(*c*-4), the ball pads for power supply 12 and the ball pads for ground 16 are alternately arranged not in the longitudinal direction but in the lateral direction. In the arrangement shown in FIG. 5(*c*-4), the same type of ball pads 12, 16 are arranged in the longitudinal direction. FIG. 5(*d*-4) is a view showing the arrangement of the balls for power supply 20*a* and the balls for ground 20*b* in the lower surface of the package substrate 30 mounted on the multilayer PCB 10 at this time.

(4) Fourth Example of Other Arrangement

A fourth example of the other arrangement is shown in FIG. 5(*a*-5). The arrangement shown in FIG. 5(*a*-5) can be realized by combination of the arrangement of the vias for power supply 2 and the vias for ground 6 shown in FIG. 5(*b*), and the arrangement of the ball pads for power supply 12 and the ball pads for ground 16 shown in FIG. 5(c-5).

With the arrangement of the ball pads, as shown in FIG. 5(c-5), the ball pads for power supply 12 and the ball pads for ground 16 are alternately arranged not in the longitudinal direction but in the lateral direction. In the arrangement shown in FIG. 5(c-5), the same type of ball pads 12, 16 are arranged in the longitudinal direction two by two. FIG. 5(d-5) is a view showing the arrangement of the balls for power supply 20a and the balls for ground 20b in the lower surface of the package substrate 30 mounted on the multilayer PCB 10 at this time.

In the arrangement shown in FIGS. 4 and 5, when the longitudinal direction perpendicular to the direction where the vias for power supply 2 and the vias for ground 6 are alternately arranged (i.e., the lateral direction in FIG. 5) is focused, the adjacent vias 2, 6 are arranged apart enough to arrange at least 2 lines of the ball pads 12, 16, and thus, in the longitudinal direction perpendicular to the lateral direction in FIG. 5, enough area to arrange components such as the bypass capacitor and the like can be provided in the lower surface of the multilayer PCB 10. Moreover, whichever type of the arrangement shown in FIGS. 4 and 5 is used, the induced electromotive forces caused by the vias in the multilayer PCB 10 are mutually cancelled, and the induced electromotive forces caused by the ball arrangement in the package substrate 30 are mutually cancelled. Thus, the reliability and the electric characteristics of the whole system including the package substrate 30 and the multilayer PCB 10 are improved.

4. Conclusion

The multilayer PCB according to the first embodiment is the multilayer PCB 10 mounting the integrated circuit (IC) 50 through the ball pads arranged on the surface. The multilayer PCB 10 includes the plurality of vias for power supply 2 electrically connected to the power supply wiring, the plurality of vias for ground 6 electrically connected to the ground wiring, the plurality of ball pads for power supply 12 connected to the balls for power supply 20a electrically connected to power supply wiring of the package substrate 30, and the plurality of ball pads for ground 16 connected to the balls for ground 20b electrically connected to ground wiring of the package substrate 30. Here, while the vias for power supply 2 and the vias for ground 6 are alternately arranged in a first direction (the direction H), they are not alternately arranged in a second direction (the direction V) perpendicular to the first direction. The ball pads for power supply 12 and the ball pads for ground 16 are alternately in at least one of the first direction and the second direction. Furthermore, the areas 13 where the ball pads for power supply and the ball pads for ground are provided are arranged on both sides in the second direction of the area 3 where the vias for power supply 2 and the vias for ground 6 are provided.

At this time, the integrated circuit (IC) 50 mounted on the multilayer PCB 10 includes the plurality of balls for power supply 20a electrically connected to the multilayer PCB 10 through the plurality of ball pads for power supply 12 of the multilayer PCB 10, and the plurality of balls for ground 20b electrically connected to the multilayer PCB 10 through the plurality of ball pads for ground 16 of the multilayer PCB 10. In the above-described integrated circuit (IC) 50, the balls for power supply 20a and the balls for ground 20b are alternately arranged in the direction where the ball pads for power supply 12 and the ball pads for ground 16 in the multilayer PCB 10 are alternately arranged.

In the above-described multilayer PCB 10, when the second direction (the direction V) is focused, the adjacent vias 2, 6 are arranged apart enough to arrange at least 2 lines of the ball pads 12, 16, and the vias for power supply 2 and the vias for ground 6 are not alternately arranged, so that enough area to arrange the components such as the bypass capacitor and the like can be provided in the lower surface of the multilayer PCB 10. Moreover, in the above-described multilayer PCB 10, since the vias for power supply 2 and the vias for ground 6 are alternately arranged in the first direction (the direction H), the occurrence of the induced electromotive forces in the multilayer PCB 10 can be suppressed. Thus, the reliability and the electric characteristics of the package substrate 30 are improved.

Furthermore, in the above-described multilayer PCB 10 and the package substrate 30, since in at least one of the first direction and the second direction, the ball pads for power supply 12 and the balls for power supply 20a, and the ball pads for ground 16 and the balls for ground 20b are alternately arranged, not only the occurrence of the induced electromotive forces in the multilayer PCB 10 but the occurrence of the induced electromotive forces in the package substrate 30 is suppressed. Thus, the reliability and the electric characteristics of the whole system including the package substrate 30 and the multilayer PCB 10 are improved.

INDUSTRIAL APPLICABILITY

The present invention can be utilized in a multilayer PCB mounting a BGA (Ball Grid Array) type integrated circuit (IC).

DESCRIPTION OF REFERENCE CHARACTERS 2 via for power supply
6 via for ground
10 multilayer printed circuit board (PCB)
12 ball pad for power supply
16 ball pad for ground
20 ball
20a ball for power supply
20b ball for ground
22 power supply wiring
26 ground wiring
32 via for power supply inside package substrate
36 via for ground inside package substrate
40 IC chip
50 integrated circuit (IC)

The invention claimed is:
1. A multilayer printed circuit board (PCB) for mounting an integrated circuit, the multilayer PCB comprising:
    a plurality of vias for power supply electrically connected to power supply wiring;
    a plurality of vias for ground electrically connected to ground wiring;
    a plurality of ball pads for power supply connected to balls for power supply electrically connected to the power supply wiring; and
    a plurality of ball pads for ground connected to balls for ground electrically connected to the ground wiring,
    wherein while the vias for power supply and the vias for ground are alternately arranged in a first direction, the vias for power supply and the vias for ground are not alternately arranged in a second direction perpendicular to the first direction, the ball pads for power supply and the ball pads for ground are alternately arranged in at least one of the first direction and the second direction, areas where the ball pads for power supply and the ball pads for ground are provided are arranged on both sides in the second direction of an area where the vias for power supply and the vias for ground are provided, and in the second direction, adjacent vias for power supply or adjacent vias for ground are arranged apart from each other so that at least two lines of the ball pads for power supply or the ball pads for ground are disposed between the adjacent vias for power supply or the adjacent vias for ground.

2. An integrated circuit mounted on a multilayer printed circuit board (PCB), comprising:
 a plurality of balls for power supply and
 a plurality of balls for ground, wherein:
 the multilayer PCB comprises:
  a plurality of vias for power supply electrically connected to power supply wiring;
  a plurality of vias for ground electrically connected to ground wiring;
  a plurality of ball pads for power supply connected to the plurality of balls for power supply of the integrated circuit, each ball for power supply electrically connected to the power supply wiring; and
  a plurality of ball pads for ground connected to the plurality of balls for ground of the integrated circuit, each ball for ground electrically connected to the ground wiring,
 in the multilayer PCB,
  while the vias for power supply and the vias for ground are alternately arranged in a first direction, the vias for power supply and the vias for ground are not alternately arranged in a second direction perpendicular to the first direction,
  the ball pads for power supply and the ball pads for ground are alternately arranged in at least one of the first direction and the second direction,
  areas where the ball pads for power supply and the ball pads for ground are provided are arranged on both sides in the second direction of an area where the vias for power supply and the vias for ground are provided, and
  in the second direction, adjacent vias for power supply or adjacent vias for ground are arranged apart from each other so that at least two lines of the ball pads for power supply or the ball pads for ground are disposed between the adjacent vias for power supply or the adjacent vias for ground, and
 in the integrated circuit, the balls for power supply and the balls for ground are alternately arranged in the at least one direction where the ball pads for power supply and the ball pads for ground in the multilayer PCB are alternately arranged.

* * * * *